(12) United States Patent
Mukasa et al.

(10) Patent No.: US 6,717,402 B2
(45) Date of Patent: Apr. 6, 2004

(54) PROBE HAVING AT LEAST ONE MAGNETIC RESISTIVE ELEMENT FOR MEASURING LEAKAGE MAGNETIC FIELD

(75) Inventors: Koichi Mukasa, Sapporo (JP); Kazuhisa Sueoka, Sapporo (JP); Michiya Kimura, Ebetsu (JP); Makoto Sawamura, Sapporo (JP); Hirotaka Hosoi, Sapporo (JP)

(73) Assignee: Hokkaido University, Sapporo (JP)

( * ) Notice: Subject to any disclaimer, the term of this patent is extended or adjusted under 35 U.S.C. 154(b) by 0 days.

(21) Appl. No.: 09/944,059

(22) Filed: Aug. 30, 2001

(65) Prior Publication Data

US 2002/0121897 A1 Sep. 5, 2002

(30) Foreign Application Priority Data

Mar. 2, 2001 (JP) ........................................ 2001-058528

(51) Int. Cl.[7] .............................................. G01R 33/09
(52) U.S. Cl. ....................................... 324/252; 324/244
(58) Field of Search ................................ 324/226, 244, 324/260, 262, 252; 250/306, 307, 310

(56) References Cited

U.S. PATENT DOCUMENTS

| | | | | |
|---|---|---|---|---|
| 5,039,943 A | * | 8/1991 | Weber et al. ................. | 324/244 |
| 5,465,046 A | * | 11/1995 | Campbell et al. ............ | 324/244 |
| 5,619,139 A | * | 4/1997 | Holczer et al. .............. | 324/318 |
| 5,623,205 A | * | 4/1997 | Tomita et al. ............... | 324/244 |
| 5,649,351 A | * | 7/1997 | Cole et al. ................. | 29/603.14 |
| 5,900,729 A | * | 5/1999 | Moser et al. ................ | 324/244 |
| 6,178,066 B1 | * | 1/2001 | Barr ........................... | 360/126 |

FOREIGN PATENT DOCUMENTS

| | | | | |
|---|---|---|---|---|
| JP | 06059004 A | 3/1994 | ........... | G01R/33/02 |
| JP | 10019907 A | 1/1998 | .......... | G01N/37/00 |

OTHER PUBLICATIONS

S.Y. Yamamoto, S. Schultz, Yun Zhang, et al., Scanning Magnetoresistance Microscopy (SMRM) as a Diagnostic for High Density Recording, *IEEE Transactions on Magnetics*, vol. 33, No. 1, Jan. 1997, pp. 891–896.

Yamamoto, S.Y. and Schultz, S., Scanning magnetoresistance microscopy, *Appl. Phys. Lett.* 69 (21), Nov. 18, 1996, pp. 3263–3265.

* cited by examiner

*Primary Examiner*—N. Le
*Assistant Examiner*—Reena Aurora
(74) *Attorney, Agent, or Firm*—Stoel Rives LLP

(57) ABSTRACT

A probe for measuring a leakage magnetic field includes a substrate, a flexible cantilever having one end fixed to the substrate and a free end, and at least one magneto resistive element arranged on the free end of the cantilever. The magneto resistive element has a width within a range from 10 nm to 1 $\mu$m as measured in a direction perpendicular to a longitudinal direction of the cantilever and in a direction in which the cantilever can be deflected.

16 Claims, 10 Drawing Sheets

PROBE HAVING AT LEAST ONE MAGNETIC RESISTIVE ELEMENT FOR MEASURING LEAKAGE MAGNETIC FIELD

TECHNICAL FIELD

The present invention relates to a probe for measuring a leakage magnetic field, comprising at least one magneto resistive element. The probe according to the present invention is applied to a microscope, an IC or the like.

BACKGROUND OF INVENTION

A microscope measuring a magnetic structure of a surface of a magnetic substance is known as a magnetic force microscope (MFM), a scanning near-field optical microscope (SNOM) or a scanning magneto-resistive microscope (SMRM), for example.

As the MFM measures a gradient of a leakage magnetic field from a sample, it is difficult to obtain a distribution of a leakage magnetic field and a magnetic structure of the sample from a value measured by the MFM. The SNOM makes use of a magneto-optical effect near a magnetic field; however, it is difficult to analyze data measured by the SNOM quantitatively because a physical phenomenon about the magneto-optical effect near the magnetic field is not clear and there is difficulty in controlling polarization at the proximity field.

The SMRM measures the leakage magnetic field from the sample directly with a magneto resistive (MR) element; therefore, the quantitative measurement in the SMRM is easier than that in the MFM and the SNOM. As to the SMRM, a basic experiment is reported in IEEE. Trans. Mag. 33(1) 891 (1997). Such a SMRM is also disclosed in JP-A-6-59004 and JP-A-10-19907.

However, a conventional probe as described in JP-A-6-59004 and JP-A-10-19907 has the MR element with a relatively large width at the order of several um, so that it is difficult to obtain a magnetic information at a relatively high resolution with the conventional probe. In order to improve the resolution of the conventional probe, it is necessary to design the conventional probe specially by junction of a magnetic probe onto a surface of the MR element or the like. As a result, a method of manufacturing the probe is complex and it is difficult to mass-produce the probes with a relatively high resolution at a relatively high yield.

DISCLOSURE OF INVENTION

It is an object of the present invention to provide a probe with a relatively high resolution capable of being mass-produced at a relatively high yield.

According to the present invention, there is provided a probe for measuring a leakage magnetic field, comprising: a substrate; a flexible cantilever having one end fixed to the substrate and a free end; and at least one magneto resistive element arranged on the free end of the cantilever. The magneto resistive element has a width within a range from 10 nm to 1 μm as measured in a direction perpendicular to a longitudinal direction of the cantilever and in a direction in which the cantilever can be deflected.

The probe according to the present invention makes use of a property that the resolution of the MR element improves as the width of the MR element becomes small in a direction perpendicular to the longitudinal direction of the cantilever and in a direction in which the cantilever can be deflected (magneto-sensitive direction). According to the present invention, by having the width of the MR element not more than 1 μm at the magneto-sensitive direction, it is possible to detect the leakage magnetic field with a wavelength of not more than 10 μm without junction of the magnetic probe onto the surface of the MR element. As a result, it is possible to mass-produce the probes with a relatively high resolution at a relatively high yield. It is possible to form the MR element having the width not more than 1 μm at the magneto-sensitive direction with a lithographic technique such as an electron beam lithography.

The smaller the width of the MR element at the magneto-sensitive direction, the shorter the wavelength in the leakage magnetic field that can be detected. If, however, the width of the MR element is smaller than 10 nm at the magneto-sensitive direction, the MR element may not have the above-mentioned property because a magnetization in a magnetic substance film composing the MR element fluctuates as a result of a thermal oscillation of the magnetization. As a result, it is necessary to have the width of the MR element be not less than 10 nm at the magneto-sensitive direction.

The MR element may be, for example, an anisotropic magneto resistive (AMR) element comprising at least one magnetic substance film, a giant magneto resistive (GMR) element comprising a multilayer structure composed of at least one magnetic substance film and at least one non-magnetic substance film or a tunneling magneto resistive (TMR) element comprising a tunnel junction of magnetic substance-insulator-magnetic substance.

Preferably, the probe according to the present invention further comprises a resistor-bridge circuit electrically connected to the magneto resistive element. Thereby, it is possible to reduce noise resulting from wiring external to the cantilever. As a result, it is possible to further improve the accuracy of a measurement by the probe that is capable of being mass-produced at a relatively high yield.

Preferably, the probe according to the present invention further comprises a stylus connected to the MR element. Thereby, it is possible to maintain a good tracking property for the position control on the face of the sample even if the sample having relatively large unevenness is measured. As a result, it is possible to further improve the accuracy of the measurement by the probe capable of being mass-produced at a relatively high yield. It is not necessary to apply a complex process of the conventional method of manufacturing the probe when the stylus is connected to the MR element. The stylus may be a carbon nanotube or a whisker composed of a magnetic substance.

According to the present invention, there is provided a probe measuring a leakage magnetic field, comprising: a substrate; a flexible cantilever having one end fixed to the substrate and a free end; at least two magneto resistive elements each arranged on the free end of the cantilever; and means for determining the leakage magnetic field in relation to a dependency along with a direction with which the magneto resistive elements are provided. The magneto resistive elements each have a width within a range from 10 nm to 1 μm as measured in a direction perpendicular to a longitudinal direction of the cantilever and in a direction in which the cantilever can be deflected.

Thereby, it is possible to measure the leakage magnetic field in relation to a dependency along with a direction with which the MR elements are provided continuously, for example, a direction parallel to a height of the probe, and it is also possible to measure a distribution of a height in the magnetic field at a relatively high resolution.

There is provided a method of manufacturing a probe comprising steps of: providing a layer composed of a flexible material on one face of a substrate; forming by a lithographic technique at least one MR element on the layer; and removing a part of the substrate to form a cantilever having one end fixed to the substrate and the free end arranged with the at least one MR element.

According to the method, as the at least one MR element is formed with the lithography, it is possible to form the MR element having a width not more than 1 μm at the magneto-sensitive direction. As a result, it is possible to mass-produce the probes with a relatively high resolution at a relatively high yield. The lithography is an electron beam lithography and so on.

Preferably, the magneto resistive element has a width within a range from 10 nm to 1 μm as measured in a direction perpendicular to a longitudinal direction of the cantilever and in a direction in which the cantilever can be deflected.

Preferably, the method further comprises a step of forming a resistor-bridge circuit on the cantilever, the resistor-bridge circuit being electrically connected to the MR element. Thereby, it is possible to mass-produce the probes with an improved accuracy of the measurement at a relatively high yield.

Preferably, the method further comprises a step of connecting a stylus to the MR element. Thereby, it is possible to mass-produce the probes with the improved accuracy of the measurement at a relatively high yield. In this case, the stylus may be a carbon nanotube or a whisker composed of a magnetic substance.

Preferably, the number of MR elements is no fewer than two. Thereby, it is possible to measure the leakage magnetic field in relation to a dependency along with a direction with which the MR elements are provided continuously, for example, a direction parallel to a height of the probe. It is also possible to measure a distribution of a height in the magnetic field at a relatively high resolution.

The present invention also provides a microscope comprising a probe measuring a leakage magnetic field, the probe comprising: a substrate; a flexible cantilever having one end fixed to the substrate and a free end; and at least one magneto resistive element arranged on the free end of the cantilever; wherein the magneto resistive element has a width within a range from 10 nm to 1 μm as measured in a direction perpendicular to a longitudinal direction of the cantilever and in a direction in which the cantilever can be deflected.

Because the microscope comprises the probe capable of being mass-produced at a relatively high yield and having a superior performance, the microscope also has a superior performance.

Preferably, a direction of a thickness of the MR element is substantially parallel to a direction of the leakage magnetic field. Thereby, it is possible to realize the microscope with a higher resolution.

The present invention also provides a tester comprising a probe measuring a leakage magnetic field, the probe comprising: a substrate; a flexible cantilever having one end fixed to the substrate and a free end; and at least one magneto resistive element arranged on the free end of the cantilever; wherein the magneto resistive element has a width within a range from 10 nm to 1 μm as measured in a direction perpendicular to a longitudinal direction of the cantilever and in a direction in which the cantilever can be deflected.

As the tester comprises the probe capable of being mass-produced at a relatively high yield and having a superior performance, the tester has a superior performance.

Embodiments of the probe according to the present invention will be described with reference to drawings.

BEST MODE FOR CARRYING OUT THE INVENTION

Figure 1A:
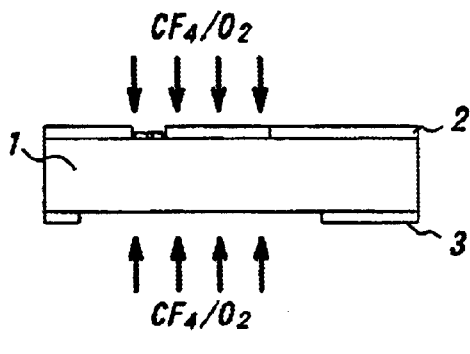
FIGS. 1(*a*) to 1(*h*) are schematic diagrams explaining a method of manufacturing a probe according to the present invention.
Figure 1B:
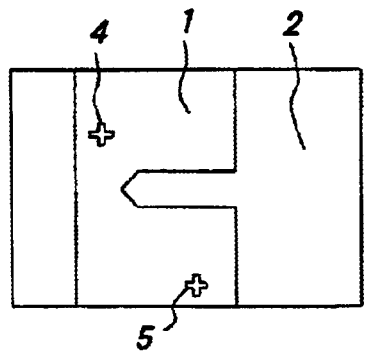
Figure 1C:
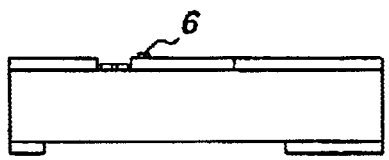
Figure 1D:
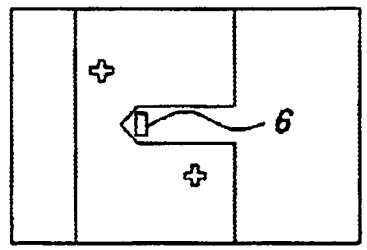
Figure 1E:
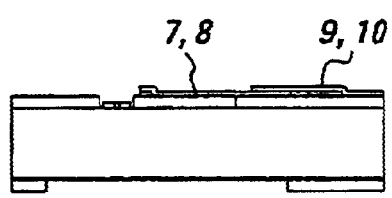
Figure 1F:
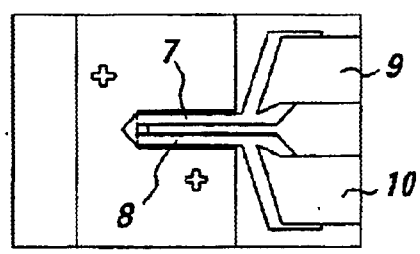

FIGS. 1(*a*) to 1(*h*) are schematic diagrams explaining a method of manufacturing a probe according to the present invention. Firstly, a silicon wafer as a substrate is prepared and nitride films 2, 3 are formed on both sides of the silicon wafer 1, respectively, using a low pressure CVD. Then, the nitride films 2, 3 are etched with photolithography and a reactive ion etching to remove a part of the nitride film 2 in order to form a cantilever, and to remove a part of the nitride film 3 in order to be etched a part of the silicon wafer 1 in an after process, so that alignment marks 4, 5 for an electron beam lithography used in a next process are formed. A side and a top of a part obtained as such are shown in FIGS. 1(*a*) and 1(*b*).

Next, an MR element 6 is formed with the electron beam lithography and a vapor deposition at a portion to be a tip of the cantilever. In this case, a size of the MR element 6 can be not more than 0.1 μm×0.1 μm. A side and a top of a part obtained as such are shown in FIGS. 1(*c*) and 1(*d*).

Next, lead electrodes 7, 8 are formed with the electron beam lithography and the vapor deposition, and a silicon nitride film or a silicon oxide for protection is formed on a surface of the MR element 6 and the lead electrodes 7, 8. Then, bonding pads 9, 10 are formed. A side and a top of a part obtained as such are shown in FIGS. 1(*e*) and 1(*f*).

Figure 1G:
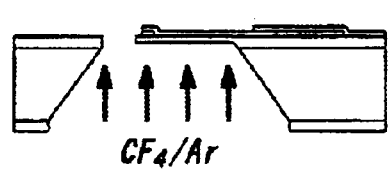
Figure 1H:
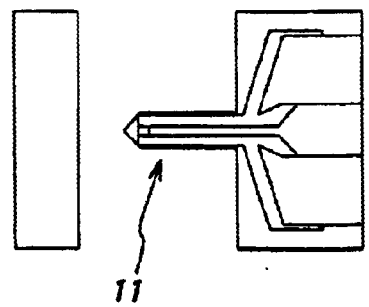

Next, a part of the substrate 1 is etched from a back face of the substrate 1 with an anisotropic etching. In this case, a throwing power of an etchant at a face in which the MR element 6 is arranged is prevented so that a part of the substrate 1 is left. Then, a part of the substrate 1 is removed with the reactive ion etching or a sputtering. Finally, a tip of a cantilever 11 is trimmed with a focusing ion beam. A side and a top of a part obtained as such are shown in FIGS. 1(g) and 1(h).

In the embodiment, the MR element 6 has a width within a range from 10 rim to 1 μm as measured in a direction perpendicular to a longitudinal direction of the cantilever 11 and in a direction in which the cantilever can be deflected (magneto-sensitive direction). The MR element 6 is an AMR element comprising at least one magnetic substance, a GMR element comprising at least one magnetic substance and at least one non-magnetic substance or a TMR element comprising a tunnel junction of magnetic substance-insulator-magnetic substance, for example.

Figure 2:
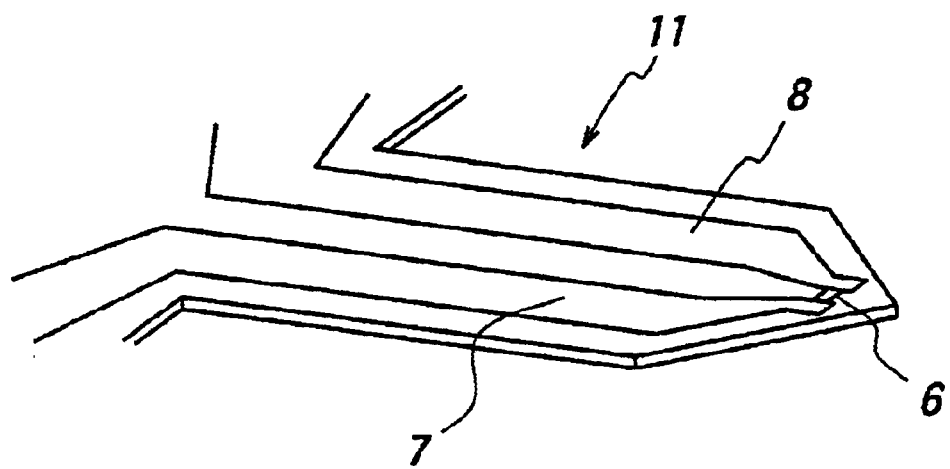
FIG. 2 is a perspective view of a probe according to the present invention.
Figure 3:
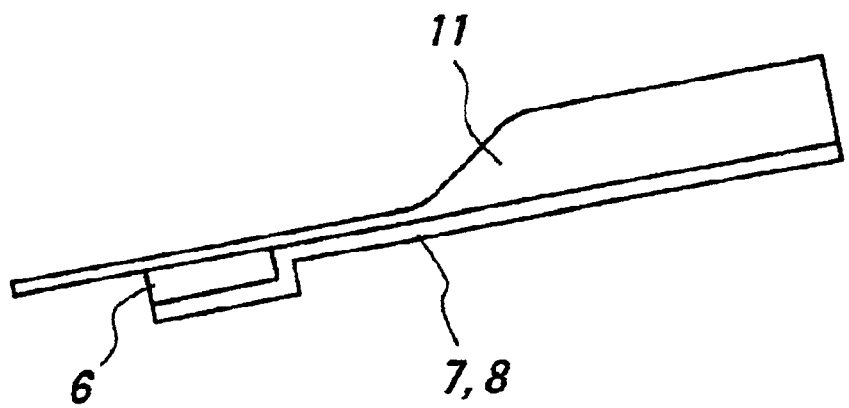
FIG. 3 is a side view of a probe according to the present invention.

A perspective view and a side view of the probe obtained in accordance with the embodiment are shown in FIGS. 2 and 3. As the width of the MR element 6 is within a range from 10 nm to 1 μm at the direction of the magneto-sensitive direction, the tip of the cantilever 11 functions as a probe for a position control.

Figure 4:
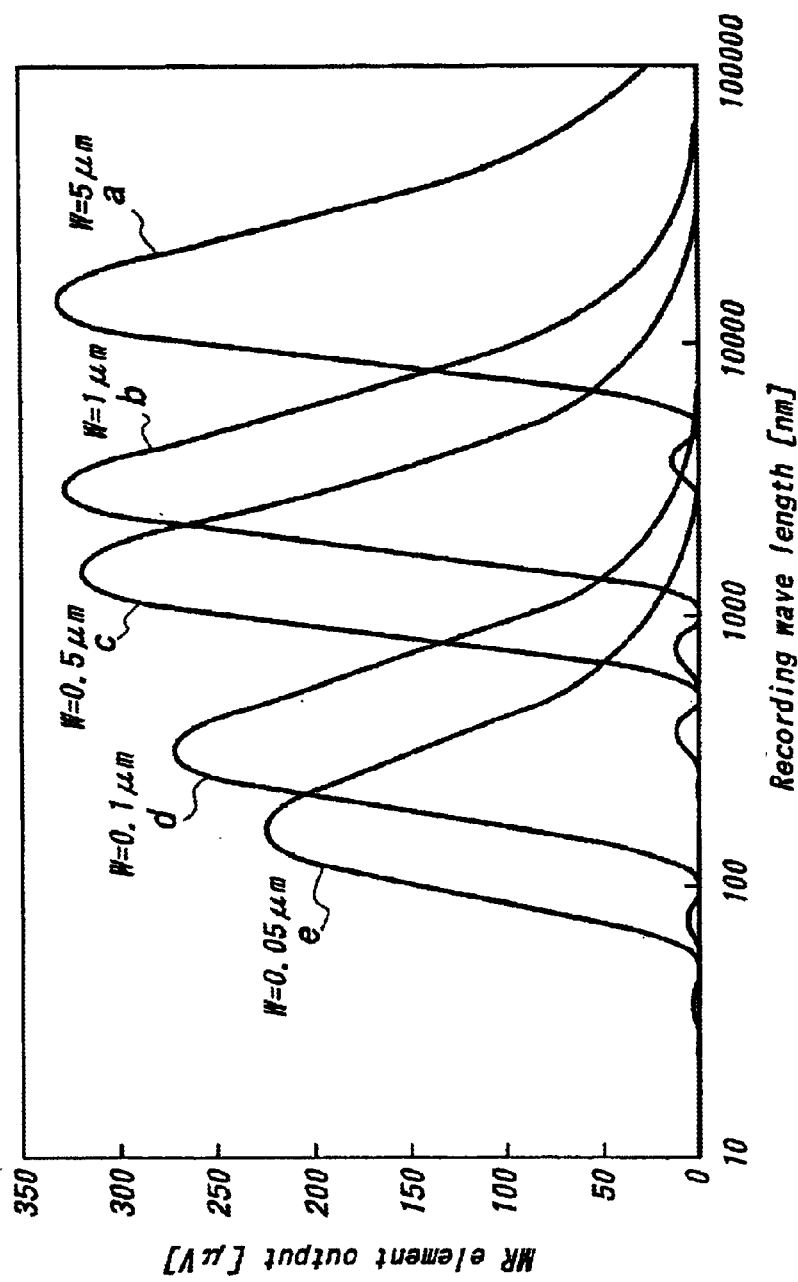
FIG. 4 is a graph showing a relation between a recording wavelength and an output of the magneto resistive element.

FIG. 4 is a graph showing a relation between a recording wavelength and an output of the magneto resistive element. In this case, an MR element output when measuring a magnetic field of a magnetic recording medium is calculated. In FIG. 4, curves a to e represent characteristics when the width w of the MR element is 5 μm, 1 μm, 0.5 μm, 0.1 μm and 0.05 μm at the magneto-sensitive direction, respectively. In this case, a current density of the MR element is $10^{11} A/m^2$.

It is apparent from FIG. 4 that a recording wavelength becomes short as the width of the MR element becomes short at the magneto-sensitive direction. When the width of the MR element is not more than 1 μm at the magneto-sensitive direction, it is possible to detect the recording wavelength not more than 10 μm, in other words, leakage magnetic field with a wavelength not more than 10 μm. As a result, it is possible to mass-produce probes with a relatively high resolution and a superior yield factor without junction of the magnetic probe onto the MR element in the prior art.

In the lithographic technique, the lower limit of the length of the MR element is several nm at the magneto-sensitive direction. However, as the width of the MR element at the magneto-sensitive direction becomes small, an effect of a thermal oscillation for a magnetization of the MR element composed of magnetic substance film is remarkable. The lower limit of the width of the MR element at the magneto-sensitive direction is given by the following condition in which a magnetic anisotropic energy fixing the magnetization equals to an energy of the thermal oscillation:

$$vK=kT/2.$$

In this case, v represents a volume of the MR element, K represents the magnetic anisotropic energy per unit volume of a magnetic substance composing the MR element, k represents Boltzmann constant, and T represents an absolute temperature.

The magnetic anisotropic energy per unit volume of the magnetic substance composing the MR element is around $5 \times 10^3$ J/m$^3$, and the length $v^{-3}$ (=w) of the MR element at the magneto-sensitive direction is 10 nm at a room temperature (T=300K).

Figure 5:
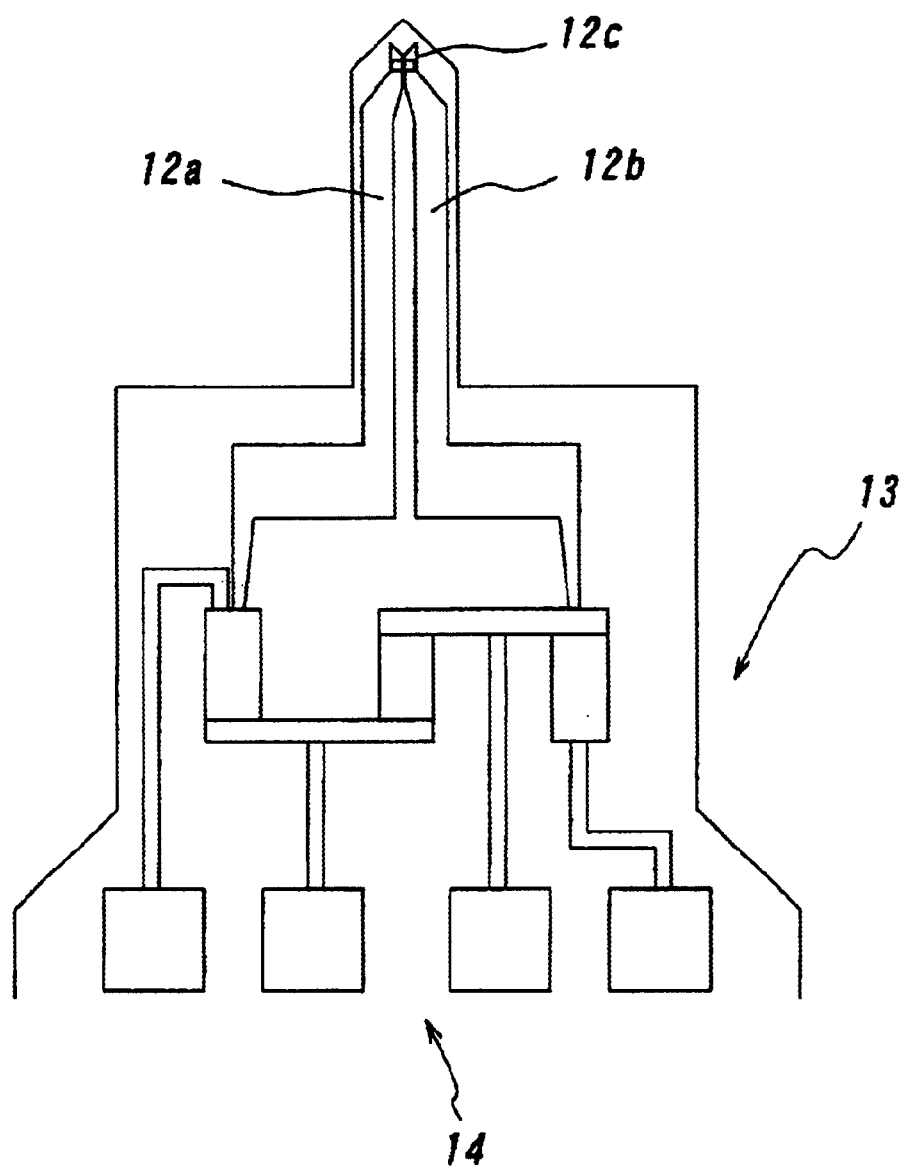
FIG. 5 is a top view of another probe according to the present invention.

FIG. 5 is a top view of another probe according to the present invention. In the embodiment, by properly selecting a wiring pattern of lead lines 12a, 12b for electrical connection to an MR element 12c and material composing the lead lines 12a, 12b, and forming a resistor-bridge circuit 14 for electrical connection to MR element 12c through the lead lines 12a, 12b on a cantilever 13, noise resulting from an external wiring of the cantilever 13 is reduced. Thereby, the accuracy of a measurement by probe further improves. In this case, a laser or a focusing ion beam is used when trimming the resistor-bridge circuit 14.

Figure 6:
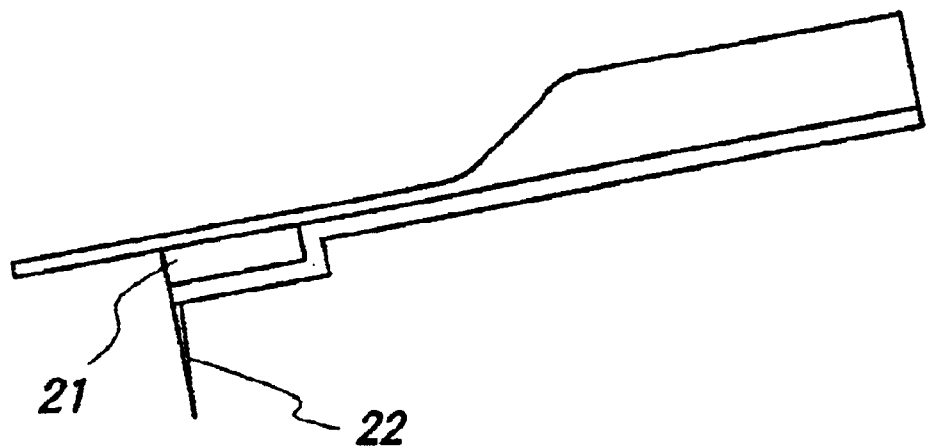
FIG. 6 is a side view of another probe according to the present invention.

FIG. 6 is a side view of another probe according to the present invention. In the embodiment, a stylus 22 is connected to a MR element 21. Thereby, a sensitivity of a magnetic field in the probe further improves, and it is possible to maintain a good tracking property for the position control on a face of a sample even if a sample having relatively large unevenness is measured. The stylus 22 is composed of a carbon nanotube or a whisker composed of a magnetic substance, for example.

Figure 7:
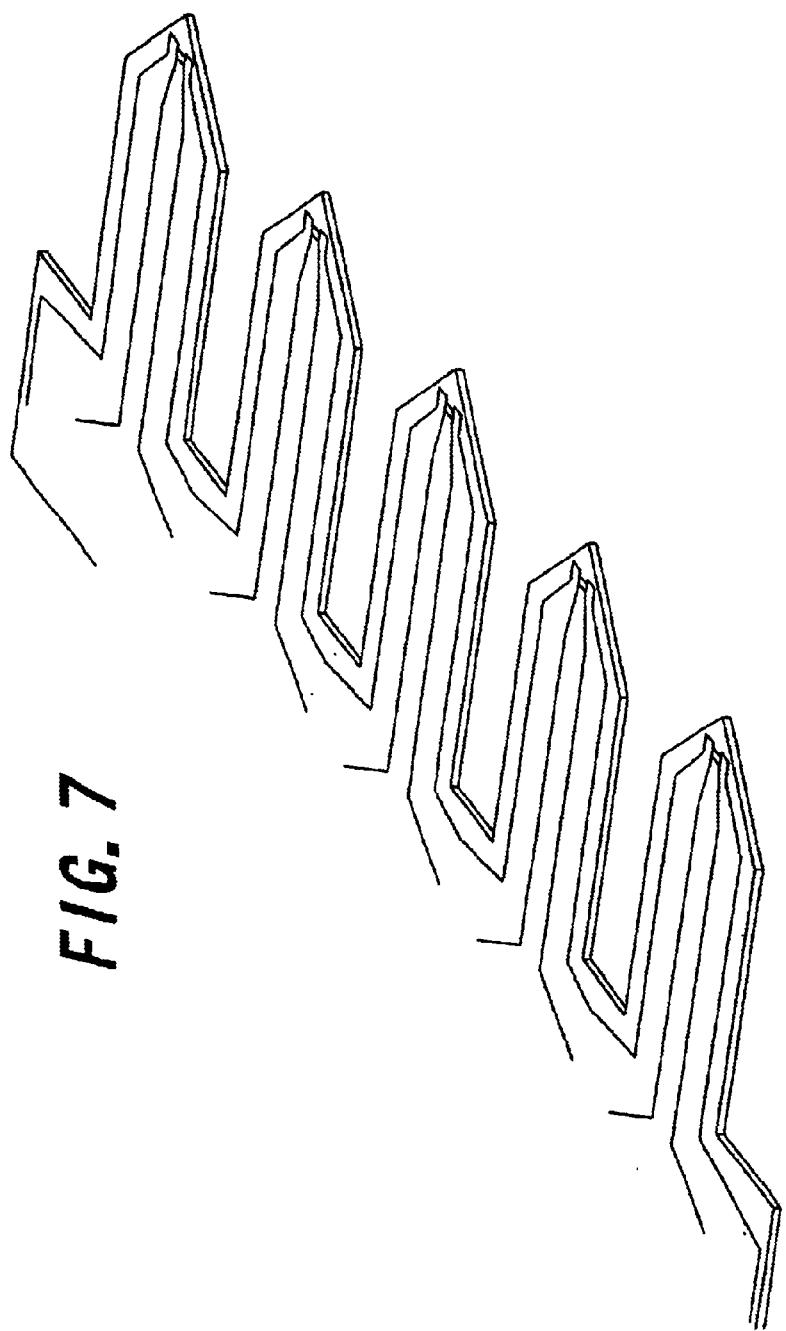
FIG. 7 is a perspective view of another probe according to the present invention.

FIG. 7 is a perspective view of another probe according to the present invention. As shown in FIG. 7, a multi-probe or a probe array can be composed by a plurality of the probes according to the present invention.

Figure 8:
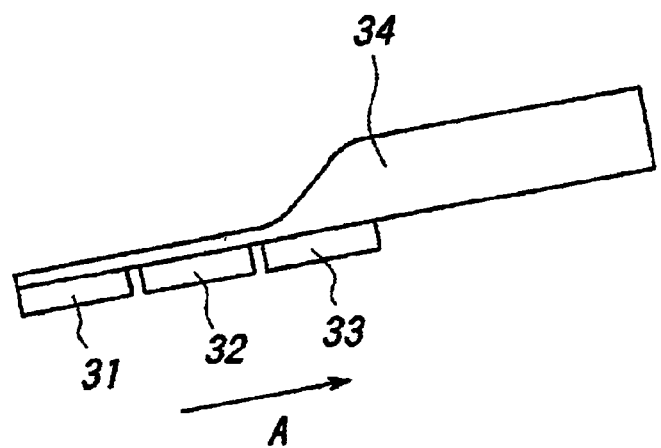
FIG. 8 is a side view of another probe according to the present invention.

FIG. 8 is a side view of another probe according to the present invention. In the embodiment, a plurality of MR elements 31, 32 and 33 are formed on one cantilever 34. Thereby, the MR elements 31 to 33 can measure a magnetic resistance along with a direction A on which the MR elements 31 to 33 are arranged continuously.

Figure 9:
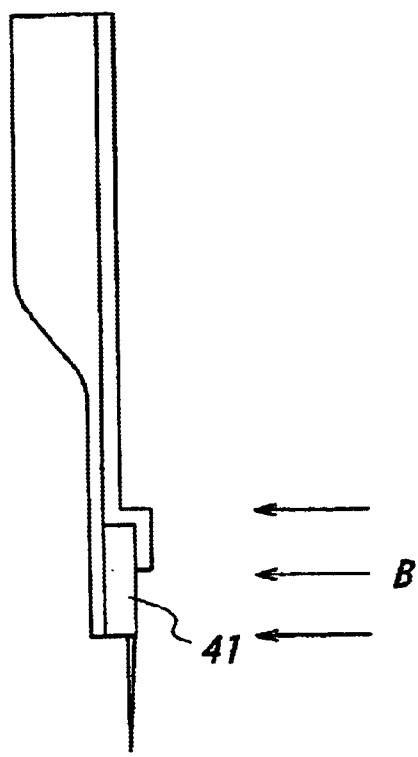
FIG. 9 is a side view of another probe according to the present invention.

FIG. 9 is a side view of another probe according to the present invention. In the embodiment, an MR element 41 is arranged so that a direction of the thickness of the MR element 41 substantially coincides with a direction B of a magnetic field. Thereby, it is possible to realize the probe with a relatively high resolution.

Figure 10:
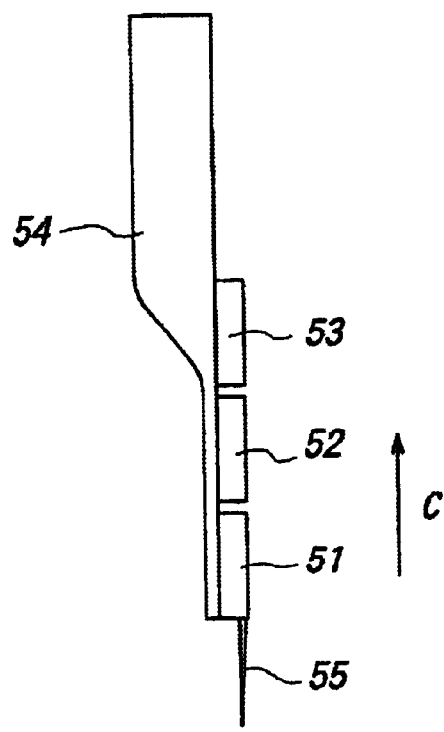
FIG. 10 is a side view of another probe according to the present invention.

FIG. 10 is a side view of another probe according to the present invention. In the embodiment, a plurality of MR elements 51, 52 and 53 are formed on one cantilever 54 and a stylus 55 is connected to the MR element 51. Thereby, it is possible to measure a magnetic distribution along a direction C of a height of the probe at a relatively high accuracy.

Figure 11:
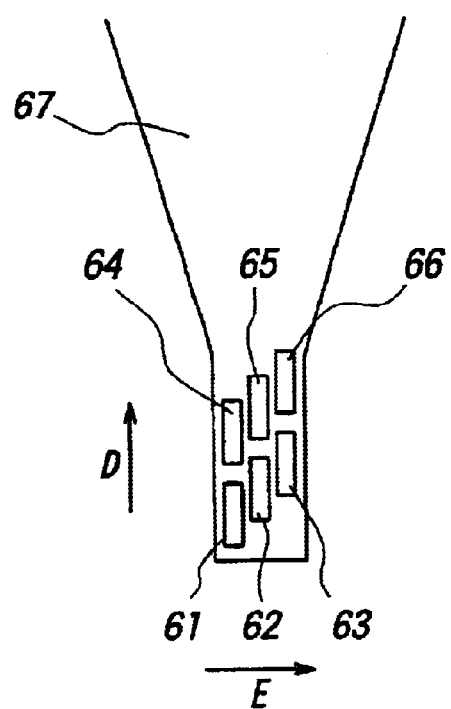
FIG. 11 is a top view of another probe according to the present invention.

FIG. 11 is a top view of another probe according to the present invention. In the embodiment, a plurality of MR elements 61, 62, 63, 64, 65 and 66 are formed on one cantilever 67. Thereby, it is possible to measure a magnetic distribution along a direction D of a height and a direction E of a width of the probe.

Figure 12:
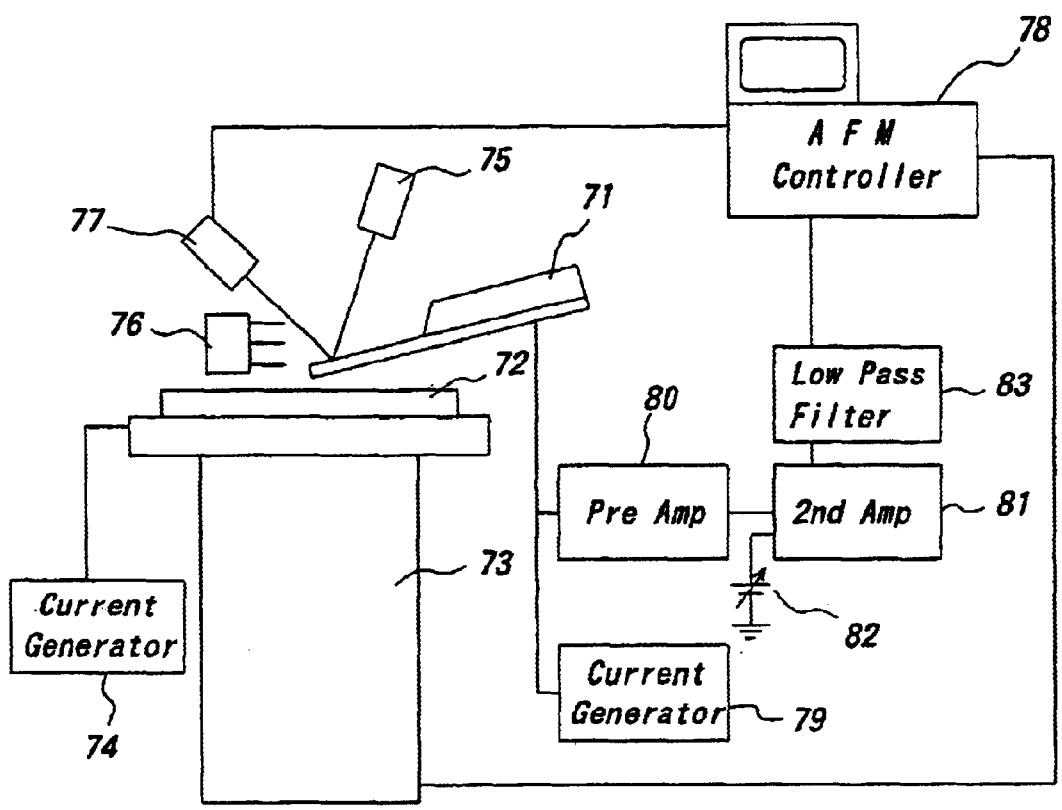
FIG. 12 is a microscope comprising a probe according to the present invention.

FIG. 12 is a microscope comprising a probe according to the present invention. The microscope comprises a probe 71 according to the present invention, a PZT tube 73 on which a sample 72 is deposited, a current generator 74 connected to the sample 72, a laser diode 75 radiating a laser beam to the probe 71, a magnet 76 generating a magnetic field, a photodiode 77 receiving the laser beam reflected from the cantilever 71, an AFM controller 78 supplied with a signal from the photodiode 77, a current generator 79 and a pre-amplifier 80 connected to the probe 71, a secondary amplifier 81 connected to the pre-amplifier 80, and a reference voltage 82 and a low-pass filter 83 connected to the secondary amplifier 81.

The AFM controller 78 controls an operation of the PZT tube 73 in three dimensional coordinate system. In the embodiment, it is possible to measure the leakage magnetic field from a surface of the sample 72 quantitatively, and apply to an observation of a magnetic structure on a surface of the magnetic body and measurement of a distribution of the leakage magnetic field of a magnetic recording head.

Figure 13:
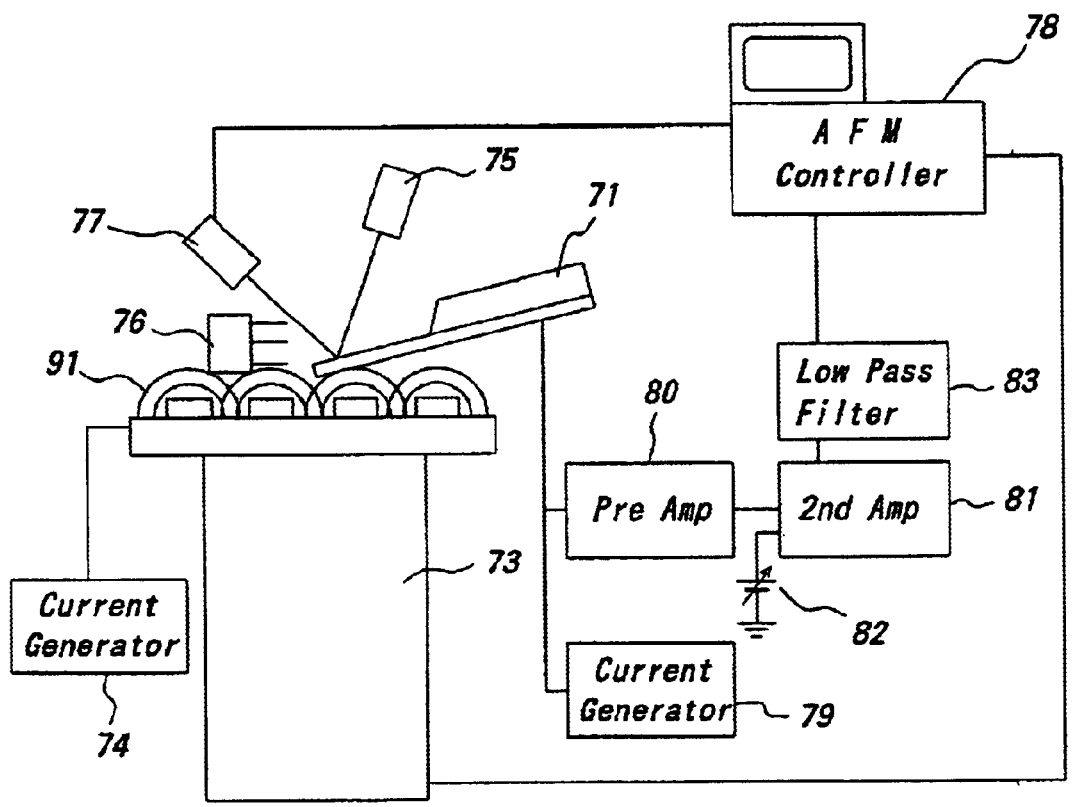
FIG. 13 is a tester comprising a probe according to the present invention.

FIG. 13 is a tester comprising a probe according to the present invention. In the embodiment, a current through the wiring is measured by measuring the distribution of the leakage magnetic field from a considerably small width of the wiring on a substrate 91. It is also possible to analyze the distribution of the magnetic field resulting from the wiring of a multilayer and measure the current in the multilayer portion by measuring the distribution of the leakage magnetic field.

While the present invention has been described above with reference to certain preferred embodiments, it should be noted that they were presented by way of examples only and various changes and/or modifications may be made without departing from the scope of the invention. For example, the electron beam lithography is used when forming the MR element in the above-mentioned embodiment; however, any other type of lithographic technique can be used. The probe according to the prevent invention is applied to the microscope and the tester; however, it can be used in any other application.

What is claimed is:

1. A probe for measuring a leakage magnetic field, comprising:
    a substrate;
    a flexible cantilever having one end fixed to said substrate and a free end, said cantilever having a longitudinal direction; and
    a magneto resistive element arranged on the free end of said cantilever, said magneto resistive element having a width within a range from 10 nm to 1 $\mu$m as measured in a direction perpendicular to said longitudinal direction of said cantilever and in a direction in which said cantilever can be deflected.

2. The probe according to claim 1, wherein said magneto resistive element has an anisotropic magneto resistive element comprising at least one magnetic substance film.

3. The probe according to claim 1, wherein said magneto resistive element has a giant magneto resistive element comprising a multilayer structure that includes at least one magnetic substance and at least one non-magnetic substance.

4. The probe according to claim 1, wherein said magneto resistive element comprises a tunneling magneto resistive element having a tunnel junction that includes a first magnetic substance, an insulator, and a second magnetic substance.

5. The probe according to claim 1, further comprising a resistor-bridge circuit electrically connected to said magneto resistive element.

6. The probe according to claim 1, further comprising a stylus connected to said magneto resistive element.

7. The probe according to claim 6, wherein said stylus comprises at least one carbon nanotube.

8. The probe according to claim 6, wherein said stylus comprises at least one whisker that includes a magnetic substance.

9. A probe measuring a leakage magnetic field, comprising:
    a substrate;
    a flexible cantilever having one end fixed to said substrate and a free end, said cantilever having a longitudinal direction;
    at least two magneto resistive elements, each arranged on said free end of said cantilever, and each having a width within a range from 10 nm to 1 $\mu$m in a direction perpendicular to said longitudinal direction and in a direction in which said cantilever can be deflected; and
    means for determining said leakage magnetic field in relation to a dependency along with a direction with which said magneto resistive elements are provided.

10. The probe according to claim 9, wherein each of said magneto resistive elements has an anisotropic magneto resistive element comprising at least one magnetic substance film.

11. The probe according to claim 9, wherein each of said magneto resistive element has a giant magneto resistive element comprising a multilayer structure that includes at least one magnetic substance and at least one non-magnetic substance.

12. The probe according to claim 9, wherein each of said magneto resistive elements comprises a tunneling magneto resistive element having a tunnel junction that includes a first magnetic substance, an insulator, and a second magnetic substance.

13. The probe according to claim 9, further comprising a resistor-bridge circuit electrically connected to each of said magneto resistive elements.

14. The probe according to claim 9, further comprising a stylus connected to each of said magneto resistive elements.

15. The probe according to claim 14, wherein said stylus comprises at least one carbon nanotube.

16. The probe according to claim 14, wherein said stylus comprises at least one whisker that includes a magnetic substance.

* * * * *